United States Patent [19]
Chen et al.

[11] Patent Number: 5,754,089
[45] Date of Patent: May 19, 1998

[54] FUSE STRUCTURE AND METHOD FOR MANUFACTURING IT

[75] Inventors: Der-Cheng Chen, Hsin-chu; Peng-Cheng Chou, Taipei, both of Taiwan

[73] Assignee: Taiwan Semiconductor Manufacturing Company Ltd., Hsin-chu, Taiwan

[21] Appl. No.: 822,665

[22] Filed: Mar. 24, 1997

Related U.S. Application Data

[62] Division of Ser. No. 684,071, Jul. 19, 1996, Pat. No. 5,652,175.

[51] Int. Cl.$^6$ ............................................. H01H 85/046
[52] U.S. Cl. ............................ 337/297; 337/1; 337/142; 337/186; 257/529
[58] Field of Search ................................ 337/1, 4, 142, 337/143, 156, 182, 186, 290, 297, 401, 405, 415; 437/60, 922; 257/529

[56] References Cited

U.S. PATENT DOCUMENTS

| | | | |
|---|---|---|---|
| 5,321,300 | 6/1994 | Usuda et al. | 257/529 |
| 5,387,311 | 2/1995 | Hall et al. | 156/630 |
| 5,578,517 | 11/1996 | Yoo et al. | 438/601 |
| 5,622,892 | 4/1997 | Bezama et al. | 438/601 |

*Primary Examiner*—Leo P. Picard
*Assistant Examiner*—Jayprakash N. Gandhi
*Attorney, Agent, or Firm*—George O. Saile; Stephen B. Ackerman

[57] ABSTRACT

A fuse structure is described in which a metallic frame is inserted between the insulation layers, through which the fuse window passes, and the final passivation layer. This frame is used as a mask during fuse window formation so alignment is simplified and problems arising from the presence of insulating residues on the surface of the fuse window layer are avoided.

9 Claims, 3 Drawing Sheets

FUSE STRUCTURE AND METHOD FOR MANUFACTURING IT

This is a division of application Ser. No. 08/684,071, filed Jul. 19, 1997, now U.S. Pat. No. 5,652,175.

BACKGROUND OF THE INVENTION

(1) Field of the Invention

The invention relates to the general area of integrated circuits, more particularly to fuses for use in those technologies.

(2) Description of the Prior Art

Fuses are used in integrated circuits as a means for breaking connections under controlled conditions. A convenient way to activate a fuse (change its resistance from short to open circuit) is to briefly irradiate it with a laser pulse. This causes the fuse element to heat up to an extent sufficient to disintegrate it but not enough to affect neighbouring parts of the integrated circuit.

Typically, the fuse will consist of a short length of a conductive layer, most commonly heavily doped silicon. Until the fuse is activated (which may be never) it needs to be protected from the environment along with all the other parts of the circuit. To this end it is covered by a fuse window—a layer of passivating material that is transparent to the activating laser radiation.

It is important that the fuse window be clear, be accurately aligned with the fuse element, and allow radiation to reach as large a portion of the fuse as possible.

SUMMARY OF THE INVENTION

It has been an object of the present invention to provide a fuse structure that has improved characteristics relative to similar fuse structures currently in use.

Another object of the present invention has been to provide a fuse structure in which perfect alignment of the fuse window relative to the fuse is not critical.

Yet another object of the present invention has been to provide a method for manufacturing said fuse structure.

These objects have been achieved in a fuse structure in which a metallic frame is inserted between the insulation layers through which the fuse window passes and the final passivation layer. This frame is used as a mask during fuse window formation so alignment is simplified and problems arising from the presence of insulating residues on the surface of the fuse window layer are avoided.

DESCRIPTION OF THE PREFERRED EMBODIMENTS

Figure 1:
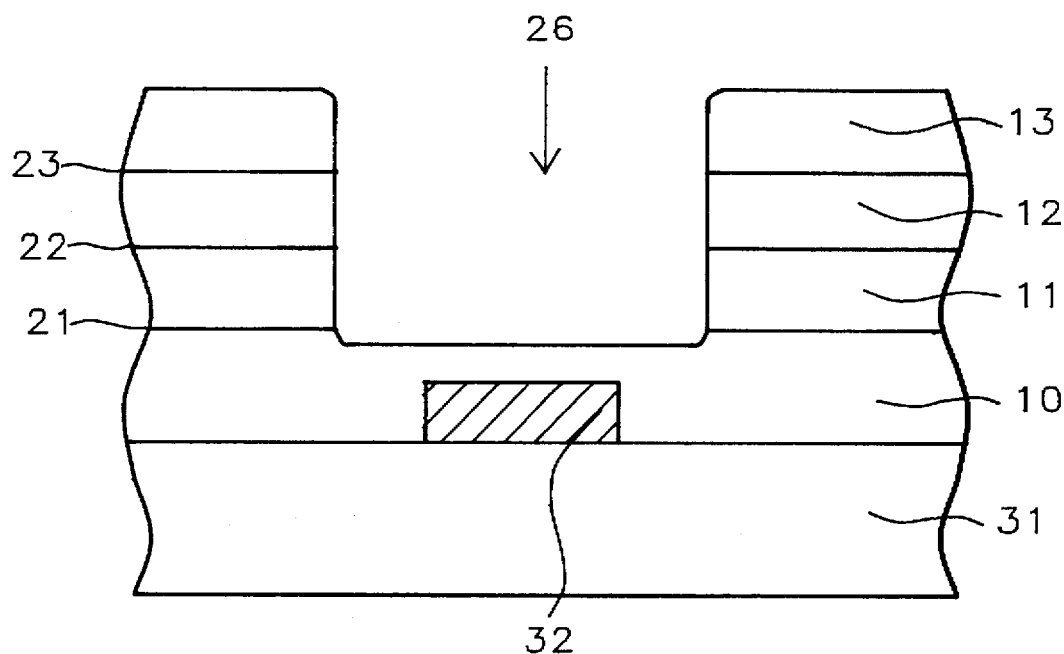
FIG. 1 is a cross-section of an idealized fuse structure.

Referring now to FIG. 1, we show there, in schematic cross-section, an idealized view of a problem-free fuse structure. Fuse element 32, formed from a layer of fusible material such as heavily doped silicon or a polycide (polycrystalline silicide) such as tungsten silicide, has been formed by depositing a layer of fusible material by means of CVD (Chemical Vapor Deposition) or LPCVD (Low Pressure CVD) onto substrate 31 to a thickness between about 0.2 and 0.3 microns and then patterning it into a strip running at right angles to the plane of the figure. Fuse window layer 10, typically consisting of PSG (phosphosilicate glass) or BPSG (boro-PSG), was then deposited, to a thickness between about 0.9 and 1 microns, over fuse element 32.

As manufacture of the integrated circuit proceeded, successive layers of metal and insulator were deposited and individually etched to form the various components of the integrated circuit. Thus, following the deposition of layer 10, first level metal M1 was deposited over it. As part of the patterning and etching of M1, it was removed from the vicinity of the fuse element so it does not appear in FIG. 1. If FIG. 1 were extended in any direction M1 would soon be seen, being located at interface 21 between layers 10 and 11, where layer 11 is the first inter-metal dielectric layer (IMD1).

Similarly, second metal layer M2 was deposited (away from the fuse element) at interface 22, second inter-metal dielectric layer 12 (IMD2) was deposited over it, and third metal layer M3 was deposited at interface 23. In general, the inter-metal dielectric layers consist of plasma enhanced oxide (PE-OX) or spin on glass (SOG) while the metallic layers are aluminum or aluminum-copper. Passivation layer 13, consisting of PE-OX or PE-nitride was then deposited over the entire integrated circuit to a thickness between about 0.85 and 1.1 microns and opening 26 was formed by etching away layers 11, 12, and 13 to expose fuse window 10.

Figure 2:
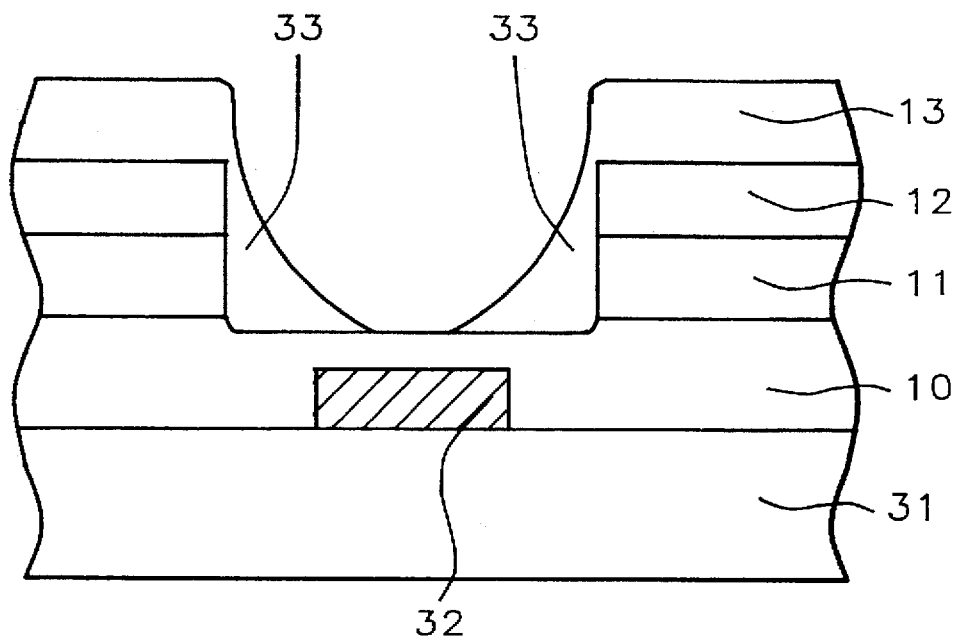
FIG. 2 illustrates problems that can arise in connection with a fuse structure designed as shown in FIG. 1.

FIG. 2 illustrates how, in practice, the fuse window may not always turn out as desired. Because of the small size of opening 26 (typically between about 5 and 6 microns on a side), misalignment and/or photoresist flow may occur, the net result being that a thin layer of passivation material 33, originally part of layer 13, may be left behind. This is highly undesirable as it will interfere with the action of the fuse activation laser when it is applied at some later time, attenuating and/or defocussing it.

Figure 3:
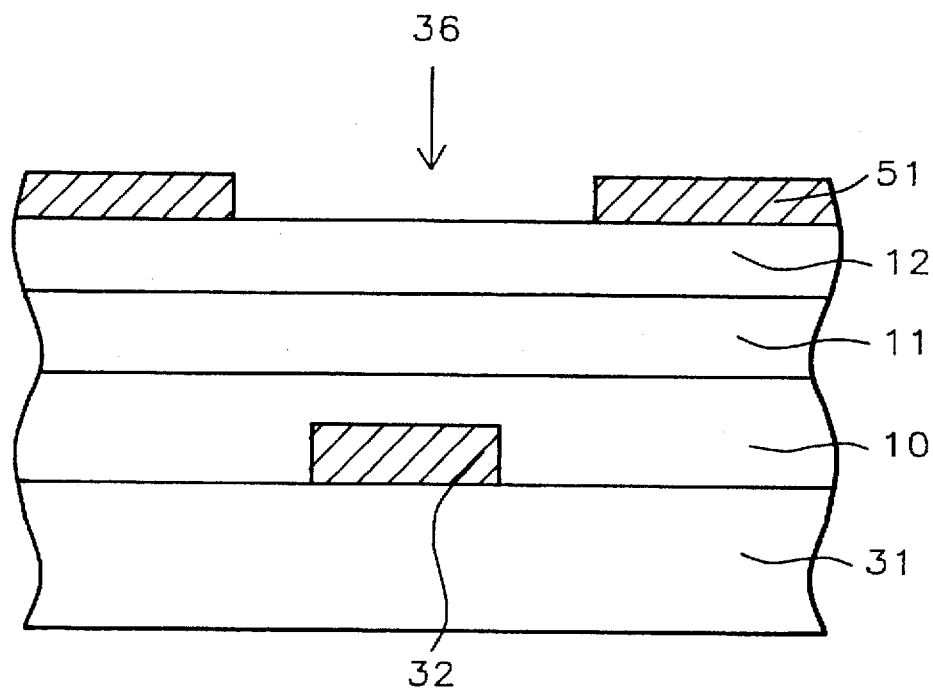
FIGS. 3 and 4 show a fuse structure manufactured in accordance with the present invention.

In FIG. 3 we illustrate how the present invention overcomes the afore-mentioned difficulties. Prior to the formation of opening 26 or the deposition of passivation layer 13, a metal layer, consisting of aluminum or aluminum-copper is deposited on layer 12, to a thickness between about 0.6 and 0.8 microns, and formed, through patterning and etching, into frame 51 whose inner opening we have labelled as 36. Typically, the inside dimension of frame 51 is between about 5 and 6 microns (2 to 3 microns larger than opening 26) while its outside dimension is at least 1 micron larger than the opening in the passivation layer.

Following the formation of frame 51, passivation layer 13 is deposited. Opening 64 is now etched in 13 using standard photolithigraphic methods and etching is allowed to continue through layers 12 and 11 (forming opening 26) until layer 10 is just reached. The chosen etchant is $SF_6+CHF_3+N_2$ which does not easily attack frame 51. Thus, the shape and position of opening 26 is determined by frame 51 rather than by the mask used to etch opening 64. Accordingly, precise alignment of opening 64 relative to the fuse link 32 is not needed now. Should misalignment and/or photoresist flow occur, the type of problem depicted in FIG. 2 will no longer arise as there is ample room between openings 26 and 64 to accommodate any undesired excess material from the edges of opening 64.

Figure 4:
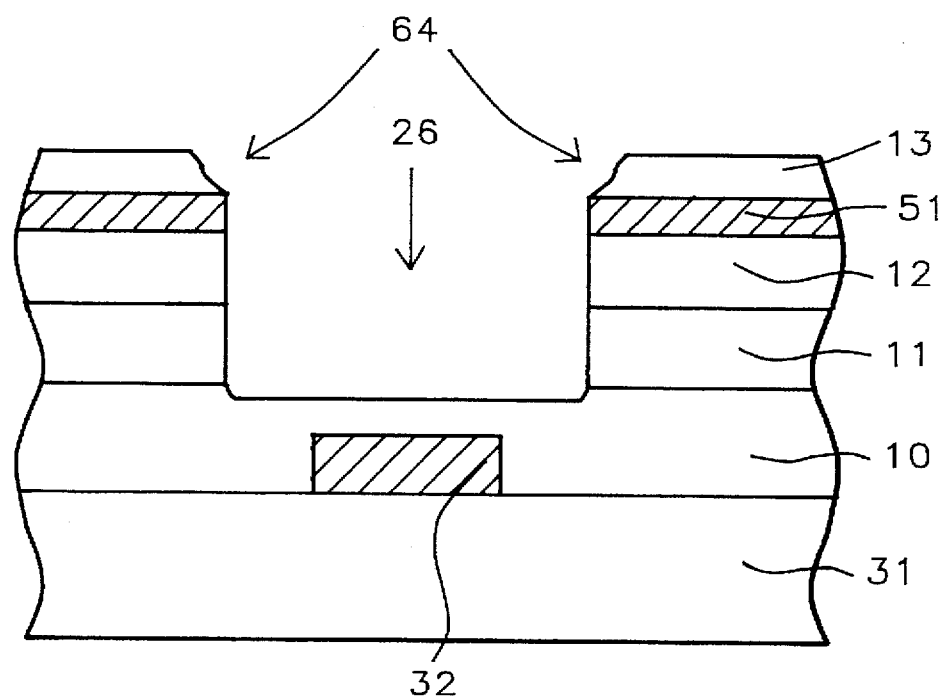
Figure 5:
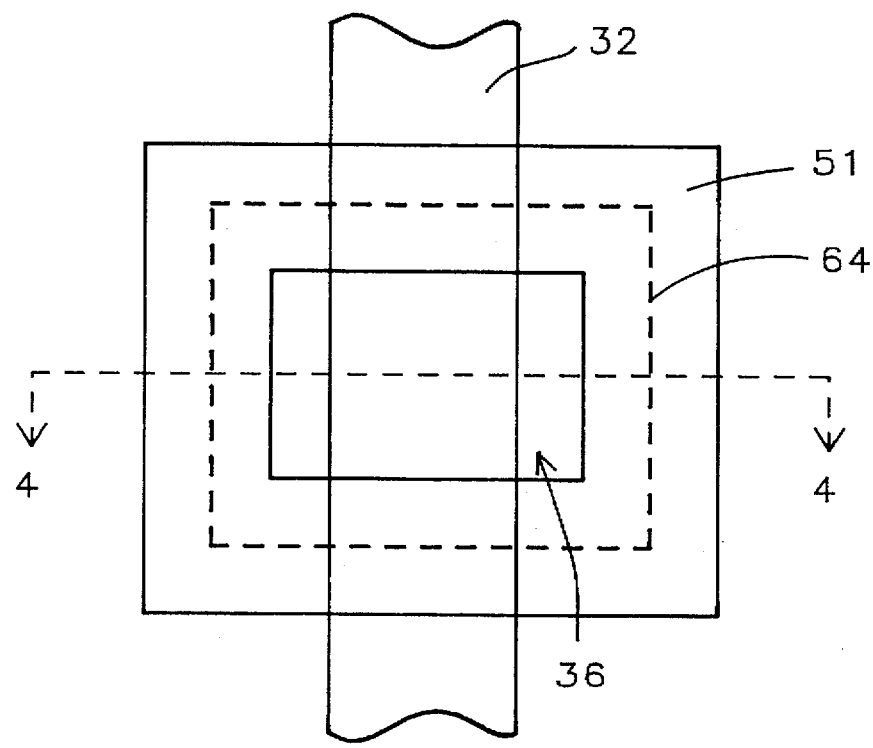
FIG. 5 is a plan view of the structure shown in FIG. 4.

FIG. 5 is a plan view of the cross section shown in FIG. 4, the latter being taken through section 4—4 in FIG. 5.

While the invention has been particularly shown and described with reference to the preferred embodiments thereof, it will be understood by those skilled in the art that various changes in form and details may be made without departing from the spirit and scope of the invention.

What is claimed is:

1. A fuse structure comprising:

a fuse element on a substrate;

a fuse window layer covering said fuse element;

at least two inter-metal dielectric layers on said fuse window layer, one of said inter-metal dielectric layers being uppermost;

a metallic frame, having inner and outer dimensions, on the uppermost inter-metal dielectric layer, said frame being directly over said fuse element and symmetrically disposed relative to it;

a passivation layer on said metallic frame and said uppermost inter-metal dielectric layer; and an opening, extending through the passivation layer and the inter-metal dielectric layers as far as the fuse window layer, said opening being, in the passivation layer, larger than the inner dimensions of the metallic frame and smaller than the outer dimensions of the metallic frame and, in the inter-metal dielectric layers, the same size as the inner dimensions of the metallic frame.

2. The structure of claim 1 wherein the fuse element comprises heavily doped silicon or tungsten silicide or a polycide.

3. The structure of claim 1 wherein the fuse window layer comprises phosphosilicate glass or borophosphosilicate glass.

4. The structure of claim 1 wherein said opening, in the passivation layer, is 2 to 3 microns larger than the inner dimensions of said metallic frame.

5. The structure of claim 1 wherein the inner dimensions of said metallic frame are between about 5 and 6 microns by about 5 and 6 microns.

6. The structure of claim 1 wherein the outer dimensions of said metallic frame are at least 1 micron larger than those of said opening.

7. The structure of claim 1 wherein said metallic frame comprises aluminum or aluminum-copper.

8. The structure of claim 1 wherein said passivation layer comprises plasma enhanced oxide or plasma enhanced nitride.

9. The structure of claim 1 wherein said inter-metal dielectric layers comprise plasma enhanced oxide or spin on glass.

* * * * *